US010585147B2

(12) United States Patent
Romero (10) Patent No.: US 10,585,147 B2
(45) Date of Patent: Mar. 10, 2020

(54) MAGNETIC FIELD SENSOR HAVING ERROR CORRECTION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 129 days.

(21) Appl. No.: 15/181,889

(22) Filed: Jun. 14, 2016

(65) Prior Publication Data

US 2017/0356967 A1    Dec. 14, 2017

(51) Int. Cl.
| | |
|---|---|
| *G01C 25/00* | (2006.01) |
| *G01R 33/00* | (2006.01) |
| *G01P 21/02* | (2006.01) |
| *G01D 5/14* | (2006.01) |
| *G01D 3/036* | (2006.01) |
| *G01R 33/07* | (2006.01) |
| *G01R 33/09* | (2006.01) |
| *G01P 3/487* | (2006.01) |

(52) U.S. Cl.
CPC ....... *G01R 33/0017* (2013.01); *G01D 3/0365* (2013.01); *G01D 5/145* (2013.01); *G01P 21/02* (2013.01); *G01R 33/0029* (2013.01); *G01R 33/077* (2013.01); *G01R 33/09* (2013.01); *G01P 3/487* (2013.01)

(58) Field of Classification Search
CPC ............ G01R 33/0017; G01R 33/0029; G01R 33/077; G01R 33/09; G01D 18/00; G01P 21/02

USPC .......................................................... 702/93
See application file for complete search history.

(56) References Cited

U.S. PATENT DOCUMENTS

| | | | |
|---|---|---|---|
| 4,668,914 A | 5/1987 | Kersten et al. | |
| 4,761,569 A | 8/1988 | Higgs | |
| 4,829,352 A | 5/1989 | Popovic et al. | |
| 5,541,506 A | 7/1996 | Kawakita et al. | |

(Continued)

FOREIGN PATENT DOCUMENTS

| | | |
|---|---|---|
| DE | 10 2005 014 509 B4 | 10/2006 |
| EP | 0 631 416 B1 | 12/1994 |

(Continued)

OTHER PUBLICATIONS

PCT International Search Report and Written Opinion dated Aug. 11, 2017 for International Application No. PCT/US2017/034473; 17 Pages.

(Continued)

*Primary Examiner* — Michael P Nghiem
(74) *Attorney, Agent, or Firm* — Daly, Crowley, Mofford & Durkee, LLP (57) ABSTRACT

A magnetic field sensor includes a first magnetic field sensing element configured to produce a first signal representing a detected external magnetic field; a circular vertical hall element configured to produce a second signal representing an amplitude of the external magnetic field; and an error compensation circuit coupled to receive the first and second signal, compute an error value based on the amplitude of the external magnetic field, and apply the error value to the first signal to compensate for an error in the first signal.

14 Claims, 5 Drawing Sheets

(56) References Cited

U.S. PATENT DOCUMENTS

| | | | |
|---|---|---|---|
| 5,572,058 | A | 11/1996 | Biard |
| 5,612,618 | A | 3/1997 | Arakawa |
| 5,619,137 | A | 4/1997 | Vig et al. |
| 5,621,319 | A | 4/1997 | Bilotti et al. |
| 5,657,189 | A | 8/1997 | Sandhu |
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |
| 6,091,239 | A | 7/2000 | Vig et al. |
| 6,100,680 | A | 8/2000 | Vig et al. |
| 6,166,535 | A | 12/2000 | Irle et al. |
| 6,232,768 | B1 | 5/2001 | Moody et al. |
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1 | 10/2001 | Towne et al. |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2003/0025994 | A1* | 2/2003 | McWilliams ............ G02B 7/12 359/430 |
| 2006/0011999 | A1 | 1/2006 | Schott et al. |
| 2006/0136169 | A1* | 6/2006 | Shonai ................... G01D 3/022 702/145 |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0163333 | A1 | 7/2010 | Patil et al. |
| 2010/0164491 | A1 | 7/2010 | Kejik et al. |
| 2011/0248708 | A1 | 10/2011 | Thomas et al. |
| 2012/0313635 | A1* | 12/2012 | Daubert ............. G01R 33/0029 324/251 |
| 2013/0057257 | A1 | 3/2013 | Friedrich et al. |
| 2014/0208151 | A1* | 7/2014 | Fernandez .......... G06F 11/0793 714/2 |
| 2014/0225597 | A1* | 8/2014 | Romero ............. G01R 33/0023 324/207.12 |
| 2015/0068341 | A1* | 3/2015 | Andreasen ............... F16H 59/68 74/473.11 |
| 2015/0176964 | A1 | 6/2015 | Uberti et al. |
| 2016/0131205 | A1* | 5/2016 | Essenmacher ........ F16D 41/125 192/41 A |
| 2016/0146905 | A1* | 5/2016 | Diaconu ............... G01R 33/077 324/251 |
| 2016/0274188 | A1* | 9/2016 | Liu ................. G01R 31/318511 |
| 2016/0377690 | A1* | 12/2016 | Huber ................ G01R 33/0064 702/104 |

FOREIGN PATENT DOCUMENTS

| | | |
|---|---|---|
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2004/025742 A1 | 3/2004 |
| WO | WO 2006/056829 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2013/138942 A1 | 9/2013 |

OTHER PUBLICATIONS

Ripka et al., "Advances in Magnetic Field Sensors;" IEEE Sensors Journal; vol. 10; No. 6; Jun. 2010; 9 Pages.

Allegro Microsystems, Inc.; "High Precision Linear Hail Effect Sensor IC with a Push/Pull, Pulse Width Modulated Output;" A1351: pp. 1-23; 23 pages.

Allegro Microsystems, Inc.; "High Precision 2-Wire Linear Hall Effect Sensor IC with a Pulse Width Modulated Output" A1354; pp. 1-22: 22 pages.

Aero Microsystems, Inc.: "High Precision Linear Hall-Effect Sensor with an Open Drain Pulse Width Modulated Output;" A1356; pp. 1-20; 20 pages.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25; 25 pages.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371; 7 pages.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781; 5 pages.

Kejik,.et al.; "Ultra Low-Power Angular Position Sensor for High-Speed Portable Applications;" 2009 IEEE Sensors Conference; Oct. 25-28, 2009; pp. 173-176; 4 pages.

Reymond, et al.; "True 2D CMOS Integrated Hall Sensor;" 2007 IEEE Sensors Conference; Oct. 28-31, 2007; pp. 860-863; 4 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I²C Interface;" Aug. 14, 2008; 9 pages.

MEMSIC Corporation; MMC314xMS; "Ultra Small 3-axis Magnetic Sensor, with I²C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11; 11 pages.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13; 13 pages.

(56) References Cited

OTHER PUBLICATIONS

Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23; 23 pages.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25; 25 pages.
Allegro Microsystems, Inc.; "A3212 Data Sheet: Micropower, Ultra-Sensitive Hall-Effect Switch;" published Sep. 22, 2004; pp. 1-12; 12 pages.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13; 13 pages.
Allegro Microsystems, Inc.; "27701-AN Data Sheet: Hall-Effect IC Applications Guide;" Application Information, Rev. 2; http://www.allegromicro.com/en/products/design/hall-effect-sensor-Ic-applications-guide/AN27701.pdf; downloaded Sep. 29, 2010; pp. 1-40; 40 pages.
Allegro Microsystems, Inc.; "3235 Data Sheet 27633A, Dual-Output Hall-Effect Switch;"http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10; 10 pages.
Atherton et al,; "Sensor Signal Conditioning—an IC Designer's Perspective;" IEEE Electro International; Apr. 26-28, 1991; pp. 129-134; 6 pages.
Austria Microsystems; "AS5040 datasheet; 10-Bit Programmable Magnetic Rotary Encoder;" Revision 1.1; Jan. 2004; pp. 1-20; 20 pages.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880 ; 4 pages.
Blanchard et al.; "Cylindrical Hall Device;" International Electron Devices Meeting; Dec. 8-11, 1996; pp. 541-544; 4 pages.
Burger et al.; "New fully integrated 3-D silicon Hall sensor for precise angular-position measurements;" Sensors and Actuators, A 67; May 1998; pp. 72-76; 5 pages.
Dwyer; Allegro Microsystems, Inc.; "AN296061 Data Sheet: Ring Magnet Speed Sensing for Electronic Power Steering" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461; 3 pages.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit," The $8^{th}$ International Conference on Solid-State Sensors and Actuators and Eurosensors IX; Jan. 25-29, 1995; pp. 134-137; 4 pages.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907; 6 pages.
Hiligsmann et al.; "Monolithic 360 Degrees Rotary Position Sensor IC;" 2004 IEEE Proceedings of Sensors, vol. 3; Oct. 24-27, 2004; pp. 1137-1142; 6 pages.
Kejik et al.; "Circular Hall Transducer for Angular Position Sensing;" International Solid-State Sensors, Actuators and Microsystems Conference; Transducers; Jun. 2007; pp. 2593-2596; 4 pages.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46; 6 pages.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388; 4 pages.
Munter; "A Low-offset Spinning-current Hall Plate;" Sensors and Actuators, vol. A21-A23; Jan. 1990; pp. 743-746; 4 pages.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The $8^{th}$ International Conference on Solid-State Sensors and Acurators, Physical vol. 53, Issues 1-3; May 1996; pp. 278-283; 6 pages.
Petoussis et al.; "A Novel Hall Effect Sensor Using Elaborate Offset Cancellation Method;" Sensors & Transducers Journal, vol. 100, Issue 1; Jan. 2009; pp. 85-91; 7 pages.
Popovic; "Not-plate-like Hall magnetic sensors and their applications;" Sensors and Actuators A: Physical, vol. 85, Issues 1-3; Aug. 2000; pp. 9-17; 9 pages.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58; 4 pages.
Roumenin; "Magnetic sensors continue to advance towards perfection;" Sensors and Actuators A: Physical, vol. 46-47, Issues 1-3; Jan.-Feb. 1995; pp. 273-279; 7 pages.
Schneider et al.; "Temperature Calibration of CMOS Magnetic Vector Probe for Contactless Angle Measurement System;" International Electron Devices Meeting; Dec. 8-11, 1996; pp. 533-536; 4 pages.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.unjud.it/petrella/Azionamenti%20Elettrici%20ll/Sensori%20e%20trasduttori/Data%20Sheet%20-%202SA-10.pdf; pp. 1-7.
Van der Meer; et al; "CMOS quad spinning-current Hall-sensor system for compass application;" IEEE Proceedings of Sensors, vol. 3; Oct. 24-27, 2004; pp. 1434-1437; 4 pages.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230; 5 pages.
Banjevic; "High Bandwidth CMOS Magnetic Sensors Based on the Miniaturized Circular Vertical Hell Device;" Sep. 2011; 153 pages.
Drljaca, et al.; "Nonlinear Effects in Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; pp. 223-226; 4 pages.
Melexis MLX 90324; ""Under-the-Hood" Triaxis Rotary Position feat. SENT Protocol;" 3901090324 Data Sheet; Dec. 2008; 40 pages.
Petrie; "Circular Vertical Hall Magnetic Field Sensing Element and Method with a Plurality of Continuous Output Signals;" U.S. Appl. No. 13/035,243, filed Feb. 25, 2011; 56 pages.
U.S. Appl. No. 15/012,125, filed Feb. 1, 2016, Alpago, et al.
U.S. Appl. No. 15/012,131, filed Feb. 1, 2016, Alpago, et al.
U.S. Appl. No. 15/012,142, filed Feb. 1, 2016, Alpago, et al.
U.S. Appl. No. 15/180,199, filed Jun. 13, 2016, Romero.
Meher et al.: "50 Years of CORDIC: Algorithms, Architectures, and Applications", IEEE Transactions on Circuits and Systems; vol. 56, No. 9, Sep. 2009; p. 1893-1907 (15 pages).
Andraka, Ray: "A survey of CORDIC algorithms for FPGA based computers"; FPGA—1998, Montgomery, CA; (10 pages).
Granig et al.: "Integrated Giant Magnetic Resistance based Angle Sensor", IEEE Sensors 2006, EXCO, Daegu, Korea; Oct. 22-25, 2006; pp. 542-545 (4 pages).

(56) References Cited

OTHER PUBLICATIONS

Ausserlechner, Udo: T"The Optimum Layout for Giant Magneto-Resistive Angle Sensors", IEEE Sensors Journal, vol. 10, No. 10, Oct. 2010; pp. 1571-1582 (12 pages).
European 161/162 Communication dated Jan. 29, 2019 for European Application No. 17728390.0; 3 Pages.
Response to European 161/162 Communication dated Jan. 29, 2019 for European Application No. 17728390.0; Response filed Aug. 7, 2019; 47 Pages.

\* cited by examiner

MAGNETIC FIELD SENSOR HAVING ERROR CORRECTION

FIELD

This disclosure relates to magnetic field sensors and, more particularly, for calibration of and compensation for error in magnetic field sensors.

BACKGROUND

Magnetic field sensors can be used to detect the angle of a rotating magnetic field. Such sensors are used in various applications such as robotics, automobiles, automated manufacturing systems, etc. They are often used as a type of encoder to determine the position or speed of a rotating object. For example, a magnetic sensor can be used to detect a magnet placed on the end of a rotating cam shaft to determine the angular position or rotational speed of the shaft.

Certain magnetic field sensors use magnetoresistance or giant-magnetoresistance elements to detect the magnetic field. These elements are multilayer structures often consisting a magnetic sensing layer, a non-magnetic layer, and a magnetic fixed or pinned layer. During operation, an external magnetic field may alter the magnetic direction (i.e. the direction of the magnetic moment) of the sensing layer, thus altering an electrical resistance through the magnetresistance element. Typically, the magnetic direction of the pinned layer remains fixed. However, a strong magnetic field can alter or reverse the magnetic direction of the pinned layer, which can cause so-called spin-flop errors in the output of the magnetic field sensor.

SUMMARY

In an embodiment, a magnetic field sensor includes a first magnetic field sensing element configured to produce a first signal representing a detected external magnetic field; a circular vertical hall element configured to produce a second signal representing an amplitude of the external magnetic field; and an error compensation circuit coupled to receive the first and second signal, compute an error value based on the amplitude of the external magnetic field, and apply the error value to the first signal to compensate for an error in the first signal.

In another embodiment, an magnetic field sensor includes a magnetoresistive element configured to produce a first signal representing a detected external magnetic field, the magnetoresistive element having a first pinning layer arranged in a first direction and susceptible to alteration of the second direction in the presence of a sufficiently high amplitude of the external magnetic field; a circular vertical hall element configured to produce a second signal representing an amplitude of the external magnetic field; and an error compensation circuit coupled to receive the first and second signal, compute an error value based on the amplitude of the external magnetic field, and apply the error value to the first signal to compensate for an error in the first signal.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
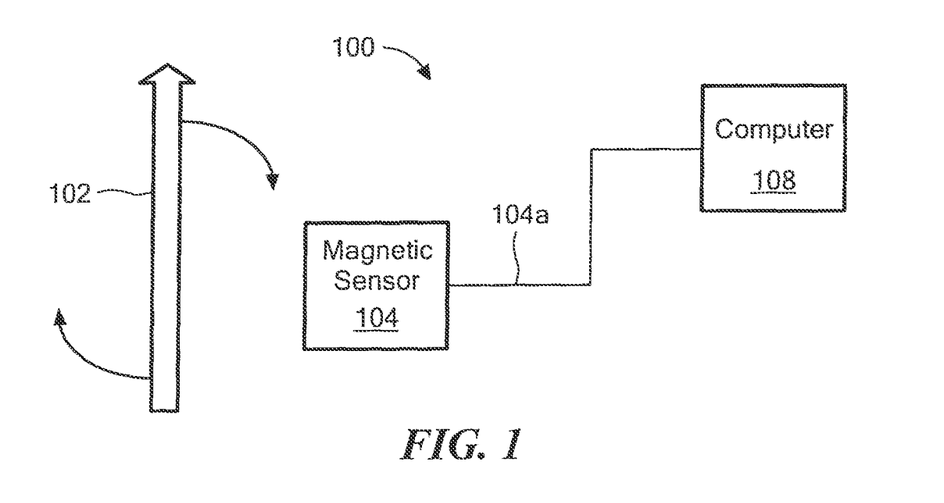
FIG. 1 is a block diagram of a system for measuring a magnetic field.

FIG. 1 is a block diagram of a system 100 for detecting a target 102. System 100 includes a magnetic sensor 104 placed adjacent to a rotating magnetic field (represented by magnetic moment arrow 102) so that a magnetic field 102 can be sensed by magnetic sensor 104. In an embodiment, magnetic field 102 may be produced by a magnetic target, such as a permanent magnet placed on an end of a rotation shaft, for example. Magnetic field 102 may rotate with respect to magnetic sensor 104. Magnetic sensor 104 may be configured to detect the angle of magnetic field 102 and produce a signal 104a representing the detected angle.

Magnetic sensor 104 is coupled to a computer 108, which may be a general purpose processor executing software or firmware, a custom processor, or an electronic circuit for processing output signal 104a from magnetic sensor 104. Output signal 104a may provide information about the angular speed, direction, and/or angular position of target 102 to computer 108, which may then perform operations based on the received information. In an embodiment, computer 108 is an automotive computer installed in a vehicle and magnetic field 102 is produced by a moving part within the vehicle, such as a transmission shaft, a brake rotor, etc. In this example, magnetic sensor 104 may detect the angle of magnetic field 102 and computer 108 may use that information to control automotive functions (like all-wheel drive, ABS, throttle control, etc.).

Figure 2:
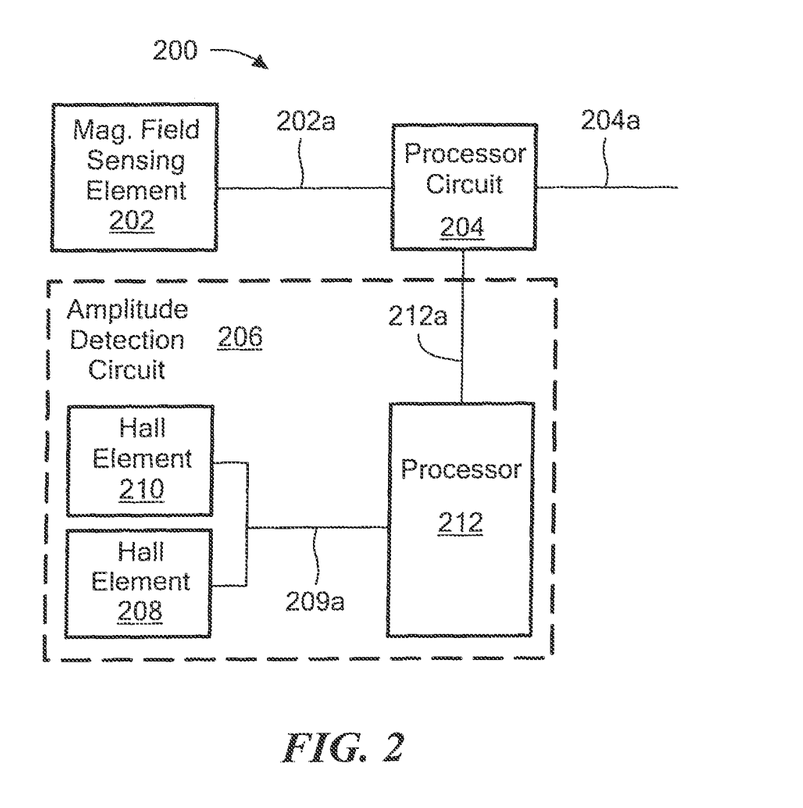
FIG. 2 is a block diagram of a magnetic field sensor.

Referring to FIG. 2, a magnetic field sensor 200 may be configured to detect an angle of rotating magnetic field 102. Magnetic field sensor 200 may include a magnetic field sensing element 202 to detect the field. Magnetic field sensing element 202 may detect the magnetic field and produce a signal 202a representing the strength of the detected magnetic field. In embodiments, the magnetic field sensing element is configured to operate in a saturation region. In an embodiment, the magnetic field sensing element 202 has an axis of maximum sensitivity. When the magnetic field is aligned with the axis of maximum sensitivity, the value of signal 202a is high, and when the magnetic field is not aligned with the axis, the value of signal 202a is low. As the direction of the magnetic field approaches the axis of maximum sensitivity, the value of signal 202a increases, and as it falls away from the axis of maximum sensitivity, the value of signal 202a decreases. Thus, the amplitude of signal 202a may provide an indication of the angle of the magnetic field. In other embodiments, magnetic field sensing element 202 may include multiple magnetic field sensing elements and/or other schemes for detecting the angle of the magnetic field.

Magnetic field sensor 200 may also include processor 204, which may receive signal 202a, compute the angle of magnetic field 102, and provide signal 204a representing the angle of magnetic field 102.

Magnetic field sensor 200 may also include an amplitude detection circuit 206 to measure the amplitude of magnetic field 102. In certain instances, the accuracy of magnetic field sensing element 202 may be affected by the amplitude of magnetic field 102. For example, if magnetic field sensing element 202 is a magnetoresistive element, the presence of a strong magnetic field 102 can generate a so-called "spin-flop" error where the pinned layer of the magnetoresistor changes direction as a function of the magnetic field angle and strength. Magnetoresistor elements may also be susceptible to so-called anisotropy error due to amplitude of the magnetic field. However, these errors occur at relatively low magnetic field levels.

Amplitude detection circuit 206 may include Hall effect elements 208 and 210 and processor 212. Hall effect elements 208 and 210 may be used to detect the strength of magnetic field 102 and produce a signal 209a representing the detected magnetic field. In an embodiment, Hall effect elements 208 and 210 are not susceptible to errors due to the strength of magnetic field 102. Although shown as a single line in FIG. 2, signal 209a may include multiple signal lines.

Processor 212 may receive signal 209a and produce an error compensation signal 212a. Error compensation signal 212a, which may be a function of the strength of detected magnetic field 102, may be received and used by processor circuit 204 to compensate for spin-flop and/or anisotropy errors in signal 202a and reduce spin-flop and/or anisotropy errors in output signal 204a.

Figure 3:
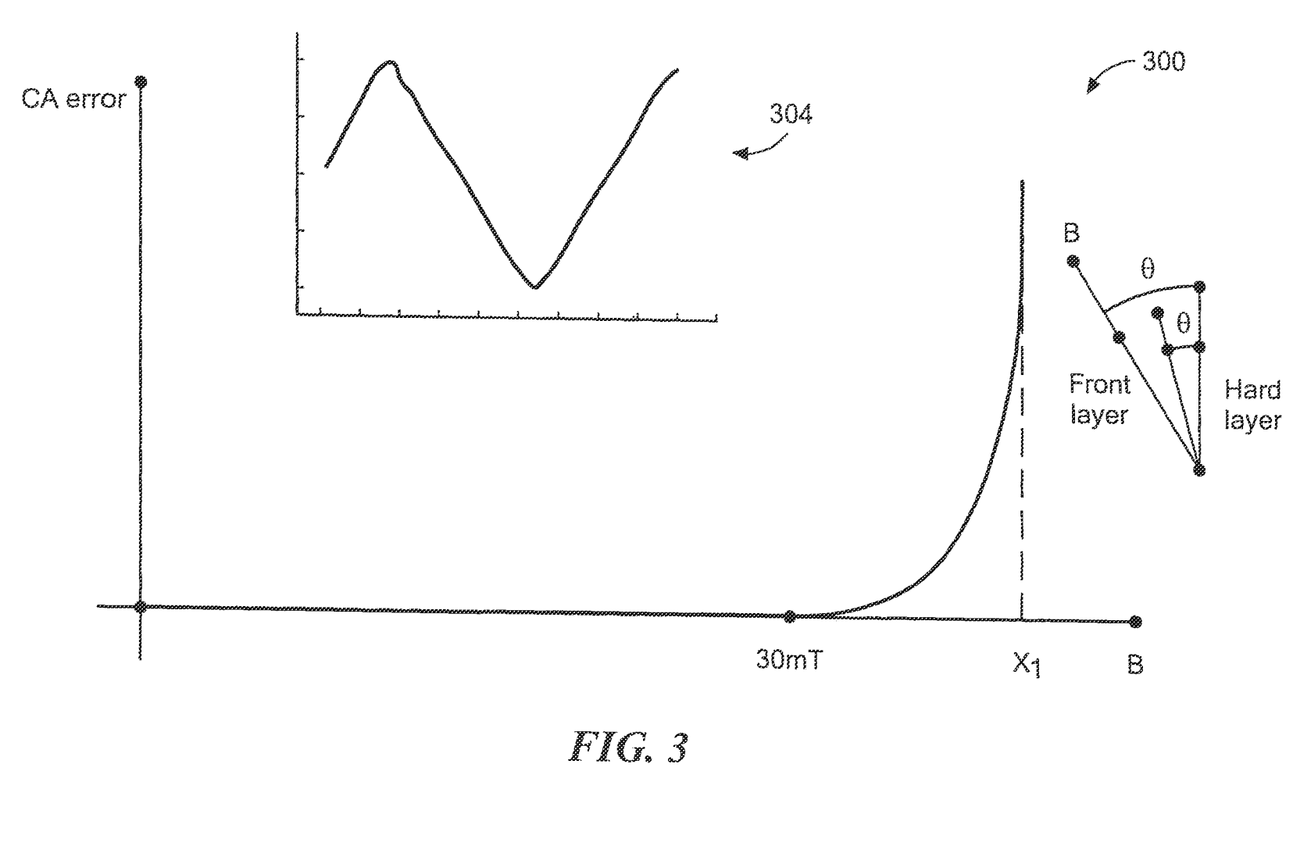
FIG. 3 is a graph of an error associated with signals of FIG. 2.

FIG. 3 is a graph illustrating a spin-flop error of a magnetoresistor. The horizontal axis in graph 300 represents magnetic field strength and the vertical axis represents the amount of error. As shown, the error spikes when the magnetic field strength reaches a value represented by the point x1. This value may vary for magnetoresistors of different designs. In an embodiment, a typical error may be up to 5-6 degrees of error at 600 Gauss of the external magnetic field.

The result of the spin-flop error is a triangular transfer function (shown in graph 304) of the magnetic field sensing element instead of an ideal sine (or cosine) function.

Figure 4:
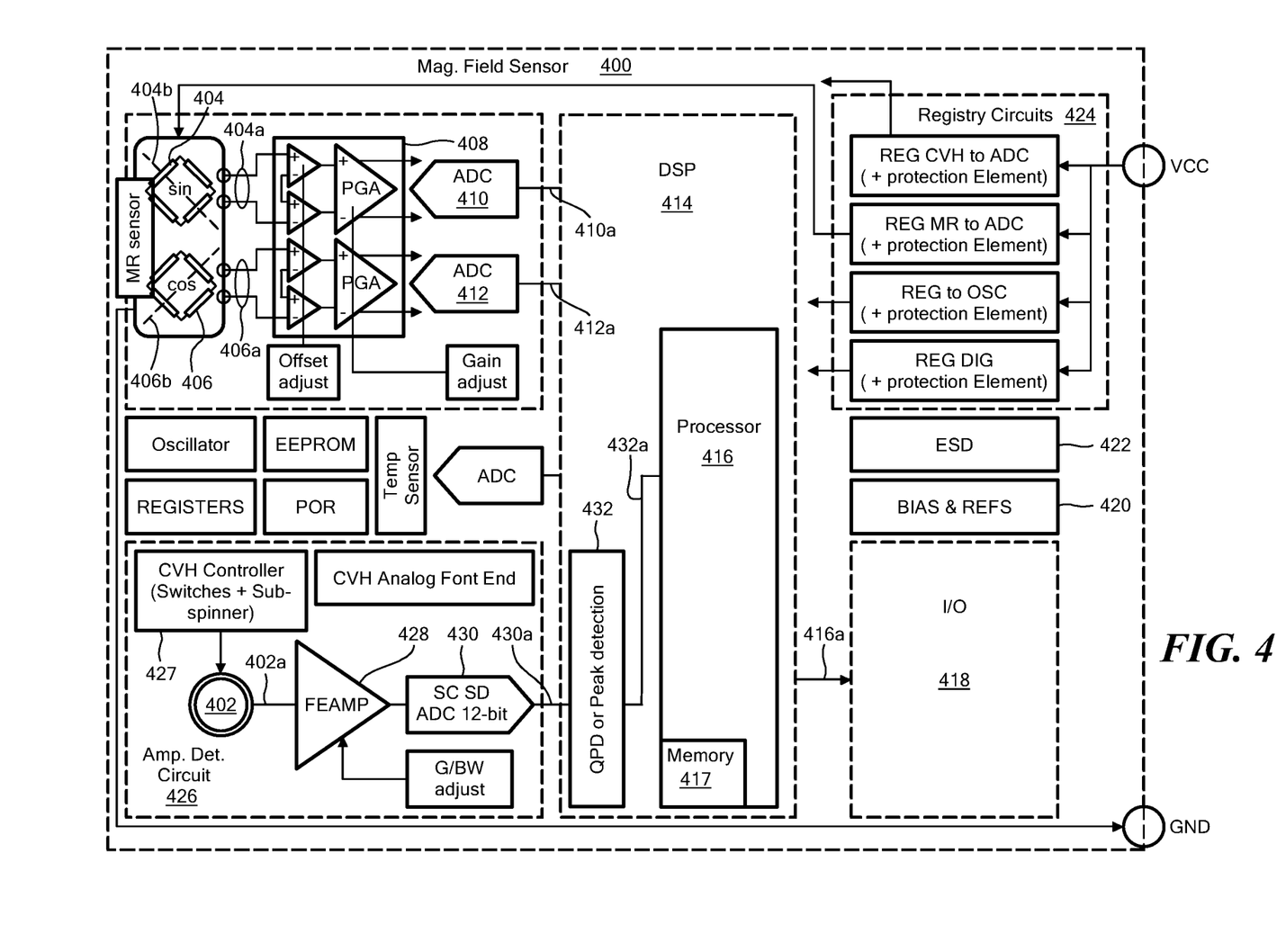
FIG. 4 is a block diagram of a magnetic field sensor including a compensation circuit.

Referring to FIG. 4, a magnetic field sensor 400 includes a circular vertical Hall (CVH) element 402 to compensate for spin-flop (or other types of) errors caused by the amplitude of the detected magnetic field 102. Two magnetoresistance magnetic field sensing elements 404 and 406 (first and second magnetic field sensing elements) are included to detect the angle of magnetic field 102. In embodiments, magnetic field sensing elements 404 and 406 are magnetoresistance bridges that produce differential output signals. In an embodiment, magnetic field sensing elements 404 and 406 are aligned so that their respective axes of maximum sensitivity are offset from each other. For example, the axis of maximum sensitivity 404b of magnetic field sensing element 404 may be offset by 45 or 90 degrees from the axis of maximum sensitivity 406b of magnetic field sensing element 406.

CVH elements may be described in U.S. Patent Application Publication 2012/0313635 and U.S. patent application Ser. Nos. 15/012,125; 15/012,131; and Ser. No. 15/012,142; which are incorporated here by reference.

Magnetic field sensing elements 404 and 406 may generate respective signals 404a and 406a representing magnetic field 102. Amplifier stage 408 receives and amplifies signals 404a and 406a. Analog-to-digital converters 410 and 412 receive the amplified signals and convert them to digital signals 410a and 412a. In the case where the axes of maximum sensitivity of magnetic field sensing elements 404 and 406 are offset by 90 degrees, signals 410a and 412a may be quadrature signals having a 90-degree phase offset from each other.

A digital signal processing (DSP) circuit 414 receives signals 410a and 412b and calculates an angle of the detected magnetic field 102. DSP circuit 414 may include processor 416, which may be a Coordinate Rotational Digital Computer (CORDIC) processor. Processor 416 may perform various trigonometric functions that can be used to compute an angle of magnetic field 102 from signals 410a and 412a. DSP circuit 414 may produce an output signal 414a that represents the computed angle of magnetic field 102.

In embodiments, magnetic field sensor 400 may also include other supporting circuits such as an I/O module 418 that may send and receive external signals, bias and reference voltage circuits 420, ESD protection circuits 422, memory and register circuits 424, oscillators, power circuits, an EEPROM, a temp sensor, etc.

In an embodiment, magnetic field sensor 400 comprises an amplitude detection circuit 426 that includes CVH element 402. Amplitude detection circuit 426 may also include CVH controller circuit 427, coupled to CVH element 402 to control and switch the individual magnetic field sensing elements within CVH element 402. An amplifier 428 and ADC circuit 402 may be included to amplify and convert CVH output signal 402 a to a digital signal 430a that is received by DSP circuit 414.

Figure 5:
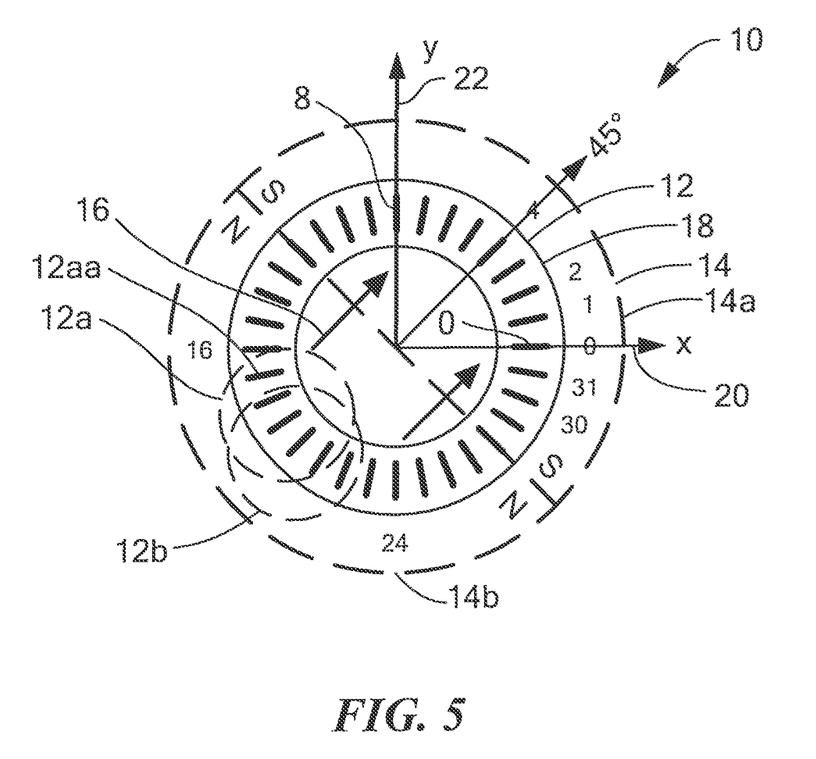
FIG. 5 is a diagram of a circular vertical Hall (CVH) element.

Referring to FIG. 5, a circular vertical Hall (CVH) sensing element 10, which may be the same as or similar to CVH element 402, includes a common circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

The term "common" circular implant region indicates that the plurality of vertical Hall elements of the CVH sensing element can have no diffused barriers between the plurality of vertical Hall elements.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the example shown in FIG. 1, there are thirty-two vertical Hall elements and thirty-two vertical Hall element contacts. However, a CVH sensing element can have more than or fewer than thirty-two vertical Hall elements and more than or fewer than thirty-two vertical Hall element contacts.

In some applications, a circular magnet 14 having a south side 14a and a north side 14b can be disposed over the CVH sensing element 12. In an embodiment, circular magnet 14 may produce rotating magnetic field 102 shown in FIG. 1. The circular magnet 14 may generate a magnetic field 16, which may be the same as or similar to magnetic field 102, having a direction from the north side 14b to the south side 14a, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crankshaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 6:
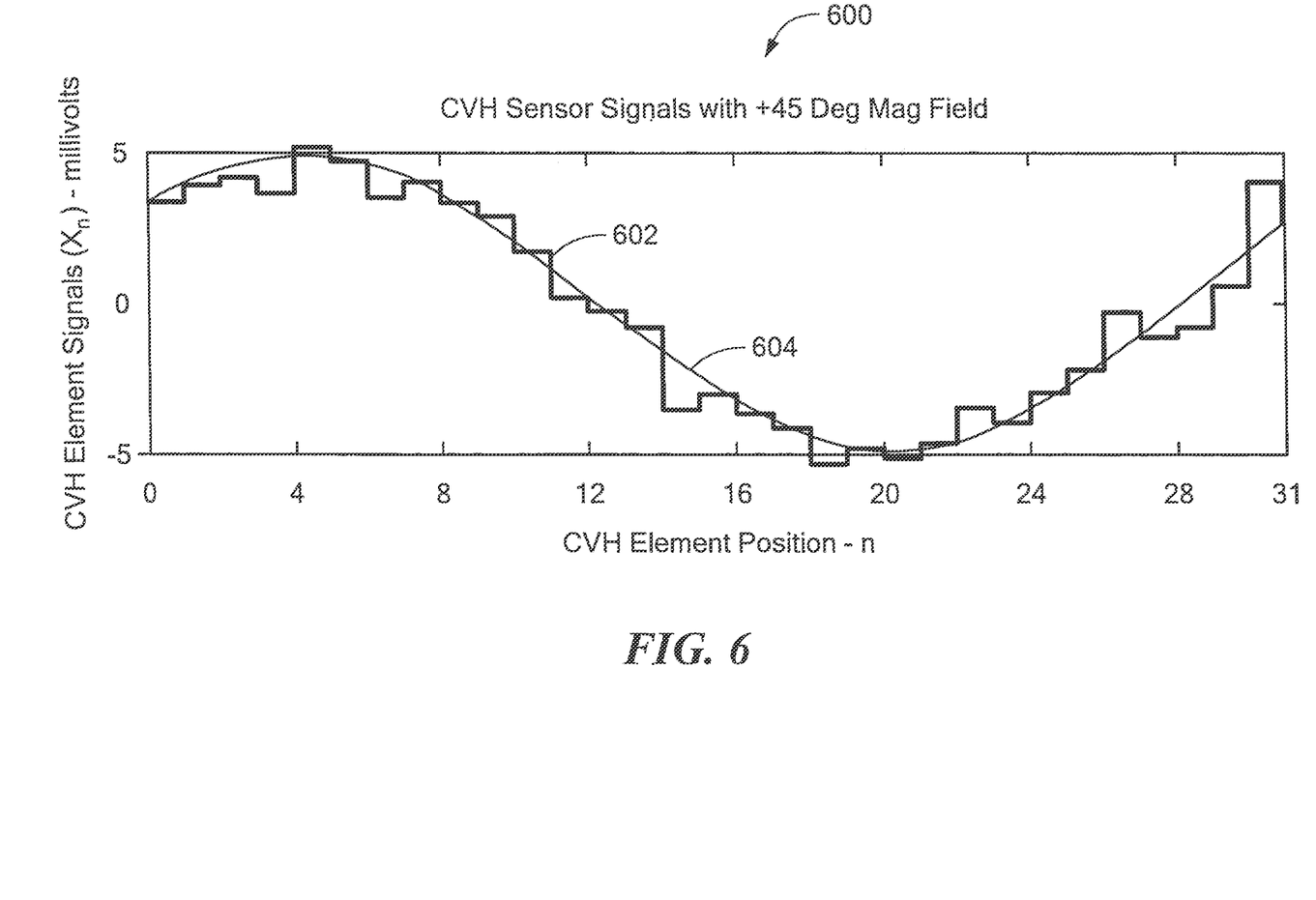
FIG. 6 is a graph of an output of the CVH element of FIG. 5.

Referring now to FIG. 6, a graph 600 has a horizontal axis with a scale in units of CVH vertical Hall element position, n, around a CVH sensing element, for example, the CVH sensing element 12 of FIG. 5. The graph 600 also has a vertical axis with a scale in units of amplitude in units of millivolts. The vertical axis is representative of output signal levels from the plurality of vertical Hall elements of the CVH sensing element.

The graph 600 includes a signal 602 representative of output signal levels from the plurality of vertical Hall elements of the CVH taken sequentially with the magnetic field 16 of FIG. 5 stationary and pointing in a direction of forty-five degrees. Signal 602 may be the same as or similar to signal 402a in FIG. 4.

The graph 600 shows one CVH sensing element cycle, i.e. one revolution of the CVH sensing element where each Hall element is activated in sequence around the circumference of the CVH sensing element. For example, the portion of signal 602 shown in graph 600 is produced during one CVH cycle as each of the Hall elements are activated around the circumference of the CVH sensing element. In this example, the CVH cycle starts with Hall element position 0, and ends with Hall element position 31. Of course, in this example, a CVH cycle can have any start and end point as long as the CVH cycle includes one revolution of the CVH sensing element.

Referring briefly to FIG. 5, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 6, a maximum positive signal is achieved from a vertical Hall element centered at position 4, which is aligned with the magnetic field 16 of FIG. 5, such that a line drawn between the vertical Hall element contacts (e.g., five contacts) of the vertical Hall element at position 4 is perpendicular to the magnetic field 16. A maximum negative signal is achieved from a vertical Hall element centered at position 20, which is also aligned with the magnetic field 16 of FIG. 5, such that a line drawn between the vertical Hall element contacts (e.g., five contacts) of the vertical Hall element at position 20 is also perpendicular to the magnetic field 16.

A sine wave 604 is provided to more clearly show the ideal behavior of the signal 602. The signal 602 has variations due to vertical Hall element offsets, which tend to somewhat randomly cause element output signals to be too high or too low relative to the sine wave 604, in accordance with offset errors for each element. In embodiments, the offset signal errors may be undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset. Chopping is described more fully in U.S. Pat. No. 8,890,518 (filed Jun. 8, 2011), which is incorporated here by reference in its entirety.

Further operation of the CVH sensing element 12 of FIG. 5 and generation of the signal 602 of FIG. 6 are described in more detail in the above-described PCT Patent Application No. PCT/EP2008/056517 which is published in the English language as PCT Publication No. WO 2008/145662, and is incorporated here by reference.

Referring again to FIG. 4, signal 430a may be a digital representation of signal 602. DSP circuit 414 may include a peak detection circuit 432 that receives signal 430a and produce signal 432a. Signal 432a may include information about when a peak is detected on signal 430a, i.e. when signal 430a has a high (or low) amplitude. In other words, signal 432a may provide information about the amplitude of signal 430a, and thus the amplitude of magnetic field 102, to processor 416. Processor 416 may then, during its operation, compensate for any spin-flop error in signals 410a and 412a caused by the amplitude of magnetic field 102.

Returning to FIG. 4, signal 430a represents the magnetic field as detected by CVH element 402. In embodiments, signal 430a can be expressed as:

$$K_{CVH}(T)*B*\cos(2\pi ft+\alpha)+\text{Off}_{CVH}(T)$$

In the equation above, $K_{CVH}$ represents the sensitivity of the CVH sensing element 12, $\text{Off}_{CVH}$ represents an offset of the CVH sensing element 12, T represents the temperature of the system, t represents time, f represents the frequency of the detected magnetic field 102, a represents the angle of the detected magnetic field 102, and B represents the amplitude (e.g. strength) of the detected magnetic field. Peak detector circuit 432 may provide signal 432a, which represents a peak (i.e. maximum value) of signal 430a. In embodiments, the Offset term $\text{Off}_{CVH}(T)$ can be ignored because signal 430a is a sinusoidal or alternating signal. Thus, the amplitude B can be calculated as, for example, a peak-to-peak value of the signal such that the DC offset will not affect the calculation. Processor 114 can evaluate signal 432a to determine whether to compensate for a spin-flop error in signals 410a and/or 412a. This maximum value can be used as an estimate for the magnetic field strength of magnetic field 102.

Referring again to FIG. 4, spin-flop errors may cause a fourth-harmonic error in the angle domain of output signal 416a. In an embodiment, processor 114 may use the estimated magnetic field strength represented by signal 432a to generate a fourth harmonic signal that matches the error signal, which can be subtracted from output signal 416a to compensate for the spin-flop error. In embodiments, processor 416 may generate the matching fourth-harmonic signal and subtract it from signals 410a and 412a (and or from signal 416a) to compensate for any spin-flop error. In other embodiments, another signal processing circuit may perform these functions.

The matching fourth-harmonic signal may be generated via a lookup table. The lookup table may be stored in a volatile or non-volatile memory associated with processor 416. For example, the lookup table may be stored in ROM 417. In an embodiment, the lookup table may associate angles of magnetic field 102 with error values, as follows:

TABLE 1

| Angle | Error Value |
|---|---|
| 0 | 0 |
| 5 | .34 |
| 10 | .64 |
| 15 | .87 |

TABLE 1-continued

| Angle | Error Value |
|---|---|
| 20 | .98 |
| 25 | .98 |
| 30 | .87 |
| 35 | .64 |
| 40 | .34 |
| 45 | 0 |

For ease of illustration, the table above may be a partial table showing error values at five-degree increments between 0 and 45. In embodiments, the table stored in memory 417 may associate error values with angles of magnetic field 102 from 0 to 90, 0 to 180, or 0 to 360 degrees. One skilled in the art will recognize that, because the error function is a fourth-harmonic function, the table may only store values for 1/16 of a complete cycle of magnetic field 102 or, in other words, from 0 to 22.5 degrees of magnetic field 102. Also, although Table 1 includes values at increments of five degrees of magnetic field 102, any increment can be used including, but not limited to: every degree, every half-degree, etc.

In an embodiment, the error values in the right column represent a harmonic signal. Thus, the angles in the left column may be incremented by the Nyquist frequency of the error signal. However, a finer increment may produce more accurate error compensation.

Processor 416 may use the table to apply an error compensation to signal 416a by, for example, multiplying the error value by a function of the detected amplitude of magnetic field 102. In an embodiment, processor 416 may use the lookup table to retrieve the error value for a particular magnetic field angle, then multiply the error value by a scalar value based on the amplitude of the magnetic field (which may be provided by peak detection circuit 432 as signal 432a).

The error values shown in the table above correspond to a sinusoidal function with a peak value of one. However, Table 1 may contain other functions and/or amplitudes depending on the error signal to be compensated. The function in Table 1 may be configured to match any error signal that is present in signal 416a so that the function in Table 1 can be subtracted from signal 416a in order to compensate for the error signal. In embodiments, Table 1 may contain a function that has the same harmonic frequency as the error signal to be compensated. Table 1 may contain a first-harmonic function, second-harmonic function, third-harmonic function, or a function of any harmonic depending on the error. In certain instances, Table 1 may contain a non-harmonic function and/or a non-continuous function having one or more discontinuities, including but not limited to asymptotic and jump discontinuities, depending on the error signal to be compensated.

One skilled in the art will recognize that using a CVH element 402 to detect amplitude of magnetic field 102 requires one CVH channel, rather than two Hall element channels as shown in FIG. 2. Also, because the strength of magnetic field 102 is encoded as amplitude of signal 402a and/or 430a, any offset in the output of the CVH element 402 may be ignored in calculating the amplitude, as mentioned above.

Having described various embodiment(s), which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this document are incorporated by reference in their entirety.

The invention claimed is:

1. A magnetic field sensor comprising:
a first magnetic field sensing element configured to produce a first signal representing an external magnetic field, wherein the first signal comprises a first angle error resulting from a characteristic of the first magnetic field sensing element;
a circular vertical Hall element configured to produce a second signal;
a detecting circuit operable to identify an amplitude of the second signal and to generate a third signal which indicates the amplitude of the second signal, wherein the third signal also indicates a function of a strength of the external magnetic field; and
an error compensation circuit configured to receive the first and third signals, wherein the error compensation circuit is operable, based on the received third signal, to compensate for the first angle error to generate an output signal representing an angle of the external magnetic field.

2. The magnetic field sensor of claim 1 wherein the first magnetic field sensing element comprises a giant-magnetoresistive element.

3. The magnetic field sensor of claim 1 wherein the error compensation circuit comprises a processor.

4. The magnetic field sensor of claim 1 further comprising a second magnetic field sensing element coupled to the error compensation circuit.

5. The magnetic field sensor of claim 4 wherein the first and second magnetic field sensing elements are magnetoresistive elements.

6. The magnetic field sensor of claim 5 wherein the first and second magnetic field sensing elements are arranged so that an axis of maximum sensitivity of the first magnetic field sensing element is substantially orthogonal to an axis of maximum sensitivity of the second magnetic field sensing element.

7. The magnetic field sensor of claim 4 wherein the first and fourth signals representing the external magnetic field are quadrature signals.

8. The magnetic field sensor of claim 1 wherein the first magnetic field sensing element is configured to operate in a saturation region.

9. The magnetic field sensor of claim 1, wherein the error compensation circuit is operable, based on the third signal, to compensate for the first angle error comprises using a table of predetermined values related to the angle of the external magnetic field.

10. A magnetic field sensor comprising:
a magnetoresistive element configured to produce a first signal representing an external magnetic field, the magnetoresistive element susceptible to internal alteration of the magnetoresistive element in the presence of a sufficiently high amplitude of the external magnetic field, wherein the first signal comprises a first angle error resulting from the internal alteration of the magnetoresistive element;
a circular vertical Hall element configured to produce a second signal;
a detecting circuit operable to identify an amplitude of the second signal and to generate a third signal which indicates the amplitude of the second signal, wherein the third signal also indicates a function of the strength of the external magnetic field; and
an error compensation circuit configured to receive the first and third signals, and is operable, based on the received third signal, to compensate for the first angle error to generate an output signal representing an angle of the external magnetic field.

11. The magnetic field sensor of claim 10 wherein the error compensation circuit comprises a processor.

12. The magnetic field sensor of claim 10 further comprising a second magnetoresistive element coupled to the error compensation circuit.

13. The magnetic field sensor of claim 12 wherein the first and second magnetoresistive elements have orthogonal maximum response axes.

14. The magnetic field sensor of claim 12 wherein the first and fourth signals representing the external magnetic field are quadrature signals.

* * * * *